United States Patent
Goodnow et al.

(10) Patent No.: US 7,903,493 B2
(45) Date of Patent: Mar. 8, 2011

(54) DESIGN STRUCTURE FOR ESTIMATING AND/OR PREDICTING POWER CYCLE LENGTH, METHOD OF ESTIMATING AND/OR PREDICTING POWER CYCLE LENGTH AND CIRCUIT THEREOF

(75) Inventors: Kenneth J. Goodnow, Essex Junction, VT (US); Clarence R. Ogilvie, Huntington, VT (US); Nitin Sharma, South Burlington, VT (US); Sebastian T. Ventrone, South Burlington, VT (US); Charles S. Woodruff, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 12/109,379

(22) Filed: Apr. 25, 2008

(65) Prior Publication Data
US 2009/0268541 A1 Oct. 29, 2009

(51) Int. Cl.
*G11C 5/14* (2006.01)
(52) U.S. Cl. .......... 365/226; 365/227; 713/300; 713/320
(58) Field of Classification Search .................. 365/226, 365/227; 713/300, 320
See application file for complete search history.

(56) References Cited

U.S. PATENT DOCUMENTS

| | | | |
|---|---|---|---|
| 6,967,891 B2 | 11/2005 | Nishihara | |
| 2004/0176878 A1 | 9/2004 | Ohnishi | |
| 2004/0219740 A1 | 11/2004 | Nishihara | |
| 2005/0120358 A1* | 6/2005 | Nikami et al. | 719/318 |
| 2005/0125702 A1* | 6/2005 | Huang et al. | 713/320 |
| 2005/0138442 A1* | 6/2005 | Keller et al. | 713/300 |
| 2006/0259791 A1* | 11/2006 | Dockser | 713/300 |
| 2007/0011475 A1 | 1/2007 | Berkes et al. | |
| 2009/0109741 A1* | 4/2009 | Bernstein et al. | 365/176 |

* cited by examiner

*Primary Examiner* — Tuan T Nguyen
*Assistant Examiner* — Toan Le
(74) *Attorney, Agent, or Firm* — David Cain; Roberts Mlotkowski Safran & Cole, P.C.

(57) ABSTRACT

A design structure is embodied in a machine readable medium for designing, manufacturing, or testing a design. The design structure includes a threshold register having a counter, a count register, and a non-volatile storage for storing a state when a value of the count register equals or exceeds a value of the threshold register. Also provided is a method of predicting and/or estimating a power cycle duration in order to save a state in non-volatile memory and a circuit. The method includes setting a threshold value; determining that the threshold value has been equaled or exceeded; and saving the state in the non-volatile memory at a first checkpoint based on the threshold value being equaled or exceeded.

20 Claims, 4 Drawing Sheets

DESIGN STRUCTURE FOR ESTIMATING AND/OR PREDICTING POWER CYCLE LENGTH, METHOD OF ESTIMATING AND/OR PREDICTING POWER CYCLE LENGTH AND CIRCUIT THEREOF

FIELD OF THE INVENTION

The present invention relates to a design structure for estimating and/or predicting power cycle length, a method of estimating and/or predicting power cycle length and a circuit thereof.

BACKGROUND OF THE INVENTION

A significant and growing number of low power applications have a usable source of power that is intermittent with little or no power during dormant periods. Many of these power sources have an available power window that is variable over the long term but relatively constant in the short term. This sort of behavior in a power source would be expected in a "heartbeat" situation or where mechanical inertia would come into play (drive shaft coupling, vibration, etc.).

In current applications, data is processed during the usable source of power. This data is processed typically in volatile memory and intermittently saved in non-volatile memory. Volatile memory loses data as soon as the system is turned off; it requires constant power to remain viable. Most types of RAM fall into this category. Nonvolatile memory, on the other hand, does not lose its data when the system or device is turned off. Thus, by using nonvolatile memory, it is possible to ensure that data can be saved in low power applications having a usable source of power that is intermittent with little or no power during dormant periods. A number of types of memory fall into this category including, for example, ROM and Flash memory storage devices.

However, it has been found that saving data in non-volatile memory has a significant energy cost. And, current applications save data constantly in the non-volatile memory as there is no way to predict when there will be a power loss. Thus, by constantly saving data in the non-volatile memory, the application is ensured that data will be saved for loading at power up, but at a cost of further power loss. Due this additional power loss, though, a significant drain is placed on the application thus leading to faster power loss.

Accordingly, there exists a need in the art to overcome the deficiencies and limitations described hereinabove.

SUMMARY OF THE INVENTION

In a first aspect of the invention, a structure a circuit for saving and restoring state in an intermittent power environment. The circuit comprises a threshold register having a counter and a non-volatile storage. The value of the threshold register is compared with a count register to determine when to save the state into non-volatile storage.

In an additional aspect of the invention, a method for predicting and/or estimating a power cycle duration in order to save a state in non-volatile memory. The method comprises setting a threshold value; determining that the threshold value has been equaled or exceeded; and saving the state in the non-volatile memory at a first checkpoint based on the threshold value being equaled or exceeded.

In a further aspect of the invention, a design structure is embodied in a machine readable medium for designing, manufacturing, or testing an integrated circuit. The design structure comprises a threshold register having a counter, a count register, and a non-volatile storage for storing a state when a value of the count register equals or exceeds a value of the threshold register.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a circuit for estimating and/or predicting power cycle length in low power applications. The invention also relates to a design structure and method for estimating and/or predicting power cycle length in low power applications. More specifically, the present invention is directed to efficiently harnessing usable power from an intermittent power source by applying power to an application for as long as possible before saving the state (e.g., processed work) in non-volatile memory. In embodiments, the non-volatile memory is assumed to have a significant state saving energy cost and, as such, the present invention will attempt to utilize the volatile memory as long as possible until power loss, at which time the state is saved in the non-volatile memory. A checkpoint save into non-volatile memory is assumed to have a significant energy cost and, by implementing the circuit, method and design structure of the present invention will significantly minimize saves in the non-volatile memory elements.

In embodiments, the assumption is that the size of the window of available power is variable over the long term but relatively constant in the short term. This behavior in a power source would be expected in a "heartbeat" situation or where mechanical inertia would come into play (drive shaft coupling, vibration, etc.). With such applications, for example, the present invention provides a prediction and/or estimation as to when there will be loss of power and, as such, the appropriate time to save the state in non-volatile memory, thereby decreasing saves in the non-volatile memory and increasing processing efficiency during a power cycle.

Circuit of the Present Invention

Figure 1:
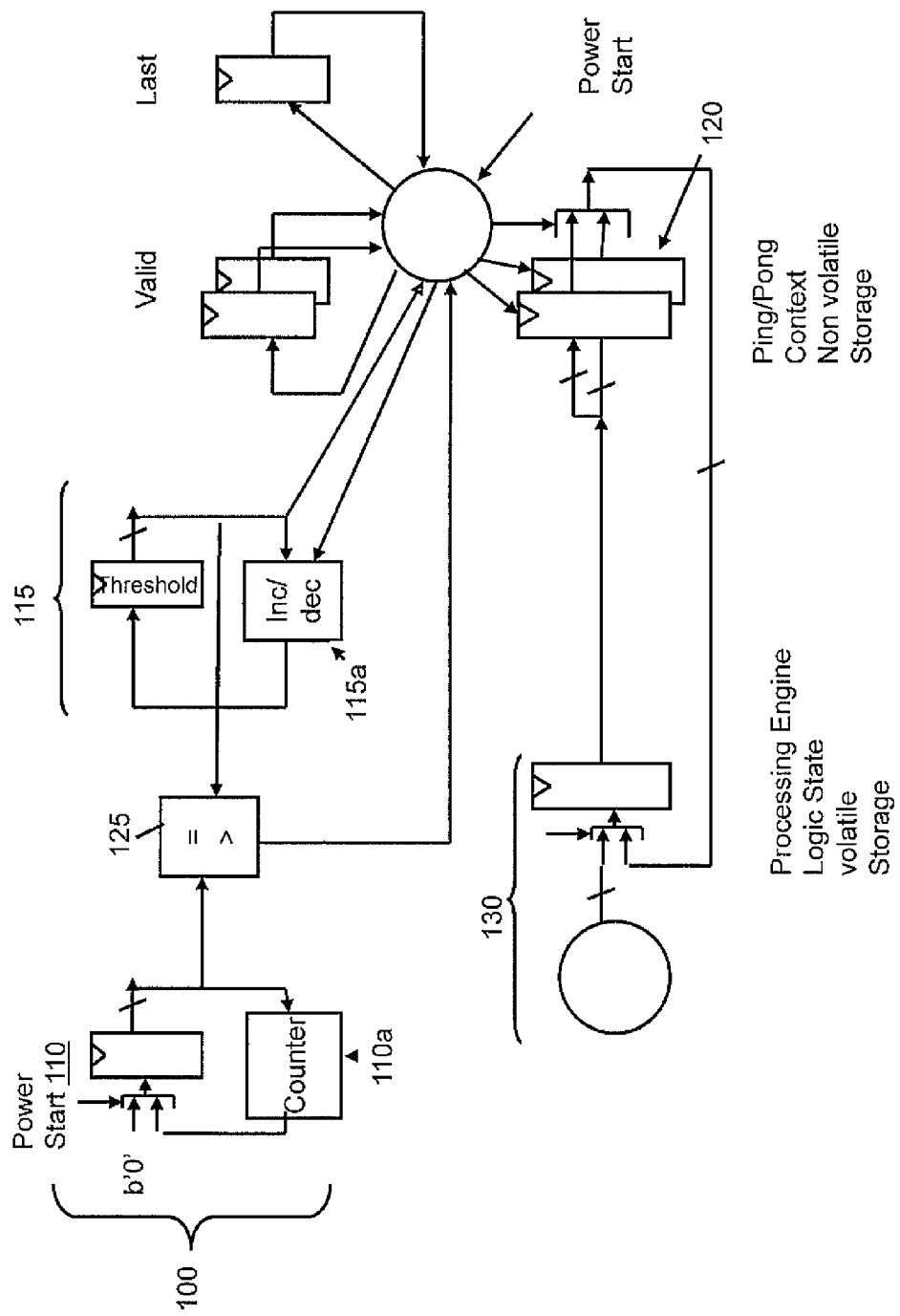
FIG. 1 represents a circuit configured to estimate and/or predict power cycle length in accordance with the invention.

FIG. 1 represents a circuit which is designed and configured to implement aspects of the invention. The circuit is generally depicted as reference numeral 100 and includes a power start component 110, which includes a counter 110*a* configured to increment the power source in a known manner. The circuit 100 also includes a threshold register 115 having a counter 115*a*. The counter 115*a* is configured to increment and/or decrement, as appropriate, at every power pulse so that the threshold register 115 can set (and save) the appropriate threshold value (checkpoint). In this way, the circuit 100 of the invention is configured to "learn" the time duration of a power "pulse" in a low or no power environment, and set a "saving" checkpoint.

Still referring to FIG. 1, the circuit 100 further includes a determination component 125. The determination component 125 determines whether the power cycle is equal to or greater than the threshold value. As the power cycle approaches the threshold value (e.g., equals the threshold value (checkpoint), as determined by the determination component 125, the circuit will save the state in the non-volatile memory 120 (from volatile storage 130). As such, the circuit 100 can use the success/failure of a checkpoint to determine whether more processing or less processing can be done during the available power window before the state is saved in non-volatile memory 120 (at a "PING" and "PONG").

More specifically, at a first power up, for example, the counter 115a will begin to increment for each power pulse. At power loss, the counter 115a will have a certain count related to the detected duration of the power cycle. The value of the counter is, in turn, provided to the threshold register 115 which sets a threshold value, e.g., a known cycle when power is lost. Thus, during a next power cycle, a state can be saved in non-volatile memory 120 when the threshold value has been met or exceeded. In subsequent power ups, the counter 115a can be incremented and/or decremented to readjust the threshold value, as discussed in more detail below. In this way, the circuit 100 of the invention can "lock" into the length of the power pulse by estimating its length assuming the current length will be similar to the previous length, and adjusting as more is known about the source.

FIG. 1 also shows "Valid" and "Last" flags, each of which is associated with the non-volatile memory 120. The flags are utilized to indicate a checkpoint, e.g., the location of a successfully saved state in the non-volatile memory 120 and duration of the cycle. For example, at a next power up, the flags will be utilized to determine whether the data in the previous power cycle was saved in the "PING" or "PONG" (i.e., "1" or "0") of the non-volatile memory 120.

In one illustrative, non-limiting example, if the last state is found to be valid, e.g., saved at "1", it is possible to load the last saved state in the volatile memory 130 to continue processing from such state. In a next power up cycle, the counter 115a can be incremented, e.g., until a new "last" and "valid" is ascertained, e.g., a new checkpoint is found. If a new checkpoint is found, the system will reset, effectively adjusting the threshold to provide for additional processing time prior to power loss. On the other hand, if the state was not properly saved at "1", e.g., due to power loss, the state can be retrieved from a prior checkpoint, e.g., "0", and, in the next power cycle the counter 115a can be decremented to readjust the power cycle length and hence reset the threshold. In this manner, only one cycle of processing data is lost due to the power loss, and the use of non-volatile memory can be minimized.

Exemplary Processes in Accordance with the Invention

Figure 2:
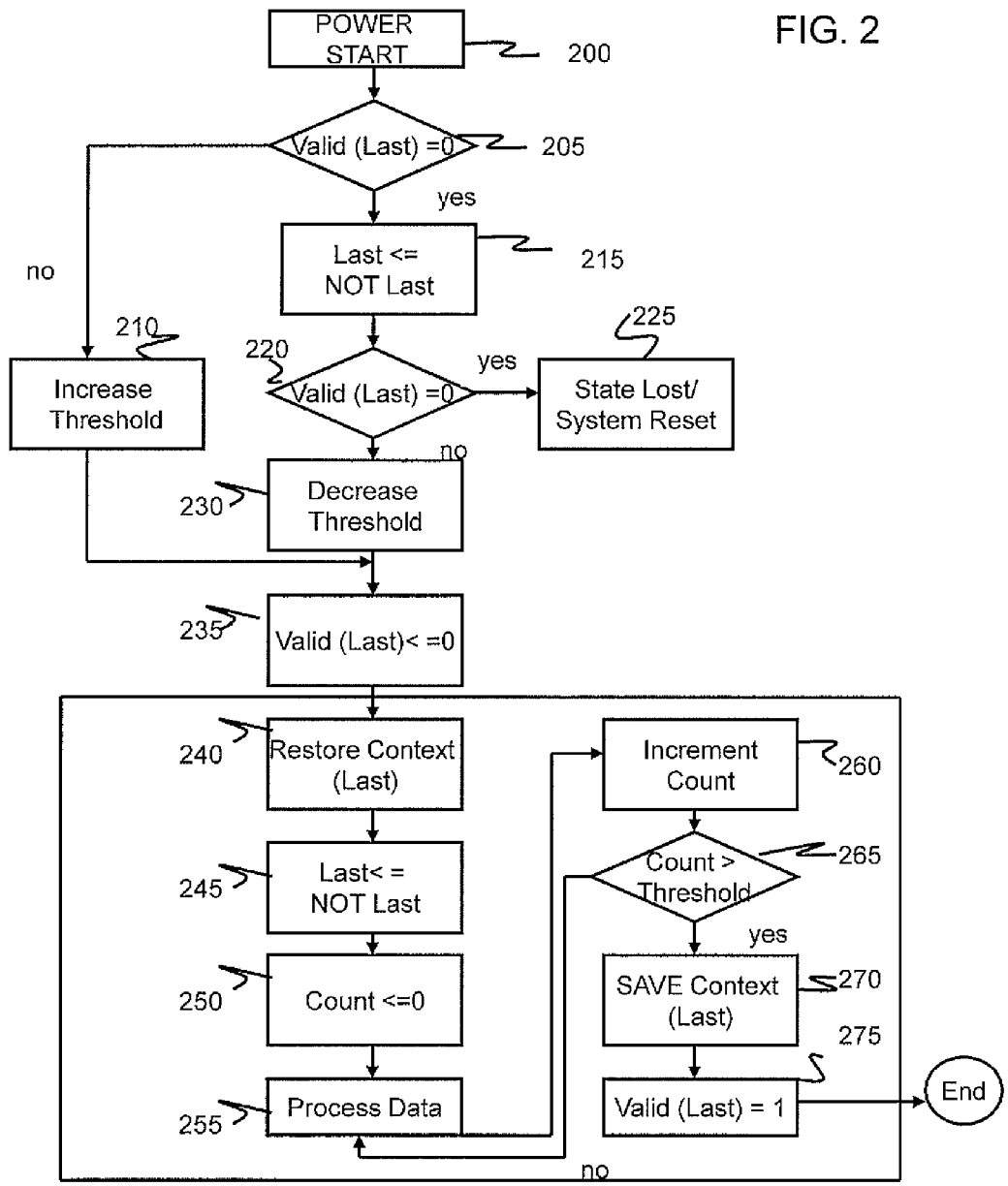
FIG. 2 is a flow diagram implementing a process in accordance with the invention.
Figure 3:
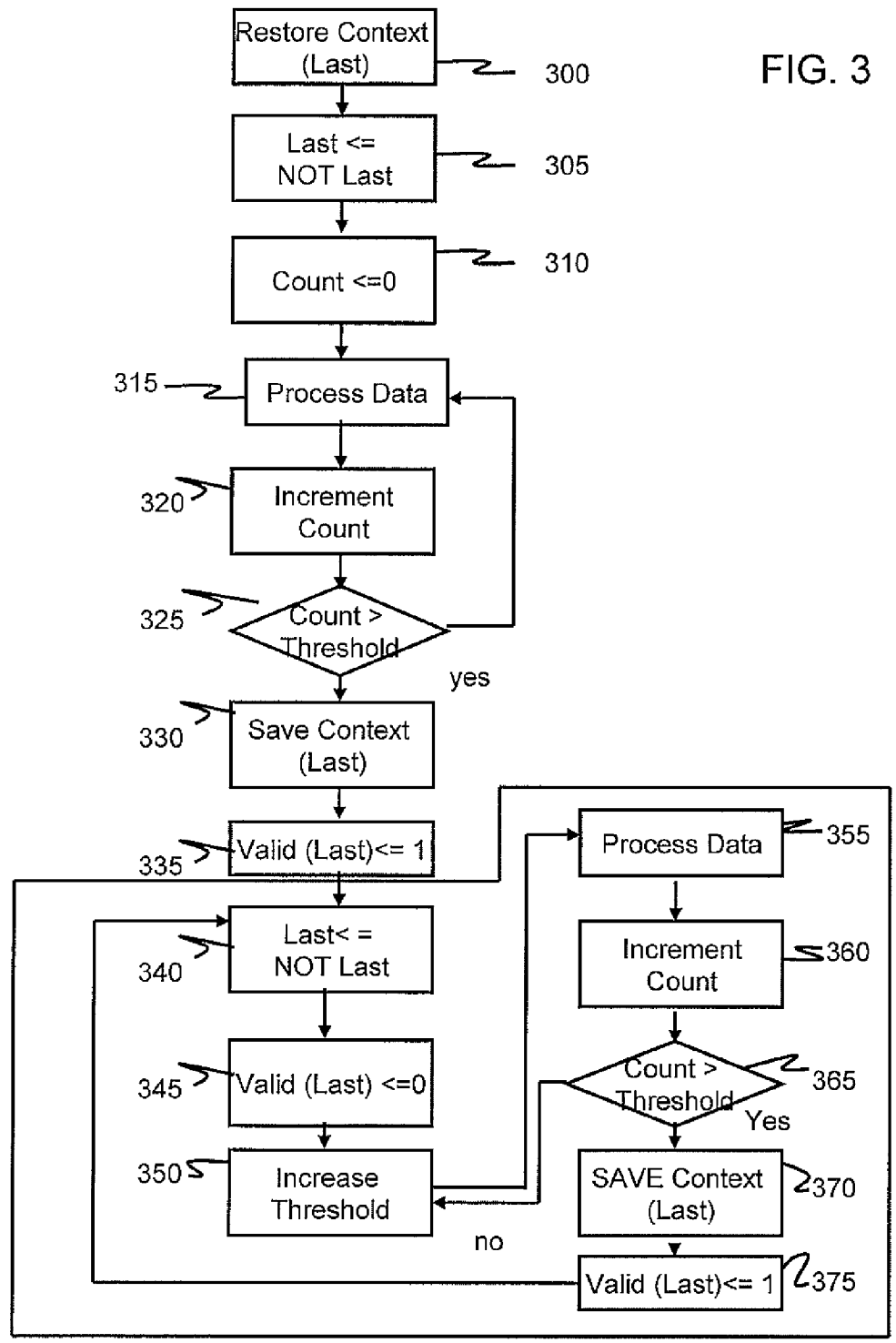
FIG. 3 is a flow diagram implementing a process in accordance with the invention.

FIGS. 2 and 3 are flow diagrams showing processing steps of embodiments of the invention. FIGS. 2 and 3 may equally represent a high-level block diagram of components of the invention implementing the steps thereof. The steps of FIGS. 2 and 3 may be implemented on computer program code in combination with the appropriate hardware (e.g., circuit). This computer program code may be stored on storage media such as read-only memory (ROM) or random access memory (RAM). The invention can take the form of an entirely hardware embodiment (e.g., the circuit of FIG. 1) or an embodiment containing both hardware and software elements.

The following is pseudo code to adjust a processing period to power event length, as shown in FIG. 2.

```
If Valid(Last) = 0                        ; If last processing step did not complete
successfully
    THEN                  ;   THEN
        Last <= NOT Last              ;   Back up to previous checkpoint
        DECREASE COUNT                ;   and decrease processing time (power even
getting shorter)
        IF Valid(Last) = 0            ;   IF previous checkpoint also invalid
            THEN *SYSTEM RESET*  ;       THEN we've lost state and must reset system
        END IF
    ELSE                          ; ELSE (last processing step completed)
        INCREASE COUNT            ;    Increase processing time threshold
END IF
RESTORE Context(Last)             ;   Restore context from last successful checkpoint
Last<=NOT Last                    ;   Flip pointer to next checkpoint storage
Count <= 0                        ;   Initialize processing timer
While count < threshold    ;   Do
    PROCESS DATA           ;       Processing
    INCREMENT COUNT               ;   increment count
END WHILE                         ;   until threshold exceeded
SAVE CONTEXT(Last)                ;   checkpoint progress in memory pointed to by
last
SAVE Valid(Last)                  ;   Validate last checkpoint
```

More specifically, at step 200, a power cycle begins. At step 205, a determination is made as to whether the last cycle (e.g., "PONG") was successfully completed during the previous power cycle, e.g., valid ("0" represents a non-valid). If the last cycle was valid, the threshold is incremented at step 210. If the last cycle was not valid, at step 215, the system will back up to the previous checkpoint (e.g., "PING"). At step 220, a determination is made as to whether the previous checkpoint (e.g., "PING") is valid. If the previous checkpoint (e.g., "PING") is not valid, at step 225, the state is lost and the system will reset, at step 225.

If the previous checkpoint is not valid at step 220, the threshold is decreased at step 230 in order to ensure that the state can be properly saved at a next power loss. After the threshold is decreased or after the threshold has been increased (steps 210 and 230), a new assignment is reset, e.g., a new checkpoint set, at step 235. At step 240, the context (previously saved data) is restored (loaded) from the last successful checkpoint and processing continues during the current power cycle. This can be done by utilizing the "last" and "valid" flags.

At step 245, the last cycle is complemented (e.g., the pointer is flipped from its current state to another state, "1" to "0" or vice versa). At step 250, the counter is assigned to "0", e.g., initialized for the next power cycle. At step 255, the data is processed during the power cycle. At step 260, the counter is incremented during the power cycle. At step 265, a determination is made as to whether the count is greater than the threshold. If the count is less than the threshold, processing continues at step 255; however, if the counter is greater than the threshold, the context is saved at step 270. At step 275, the last checkpoint is validated.

FIG. 3 shows an extension to the processing steps in accordance with the invention. Generally, FIG. 3 shows an extension of the logic of FIG. 2 continuing to process data until power failure, periodically checkpointing in a ping-pong fashion. In this embodiment, there is no need to restore context between checkpoints. Instead, it is only necessary to save context and flags indicating success. In this embodiment, as discussed in more detail below, the "threshold" value is increased as processing continues. When power is lost and restored the "threshold" is the value of the number of processing cycles successfully saved in the last checkpoint save.

Pseudocode for the optional processing until power fail can be written as follows.

At step 335, the system assigns the valid save to "1" ("PONG"). At step 340, the last cycle is complemented (e.g., the pointer is flipped from its current state to another state, "1" to "0" or vice versa). At step 345, a new assignment is reset. At step 350, the threshold is increased. At step 355, the data is processed during the power cycle. At step 360, the counter is incremented during the power cycle. At step 365, a determination is made as to whether the count is greater than the threshold. If the count is less than the threshold, processing continues at step 350; however, if the counter is greater than the threshold, the context is saved at step 370. At step 375, a new assignment is reset, and the process returns to step 340.

Additional efficiency can be had with the addition of a timer and a failure latch time. When an unsuccessful number of cycles occur, the processes can set a flag that states that a failure has occurred recently, where recently is defined as a time period measured by current time, e.g., failure latch time. After the current time has moved beyond the set time period the recent error flag is reset. During the time that recently failed the count threshold counter is not incremented. When the recently failed bit is reset then the threshold count counter is allowed to increment.

Design Structure

Figure 4:
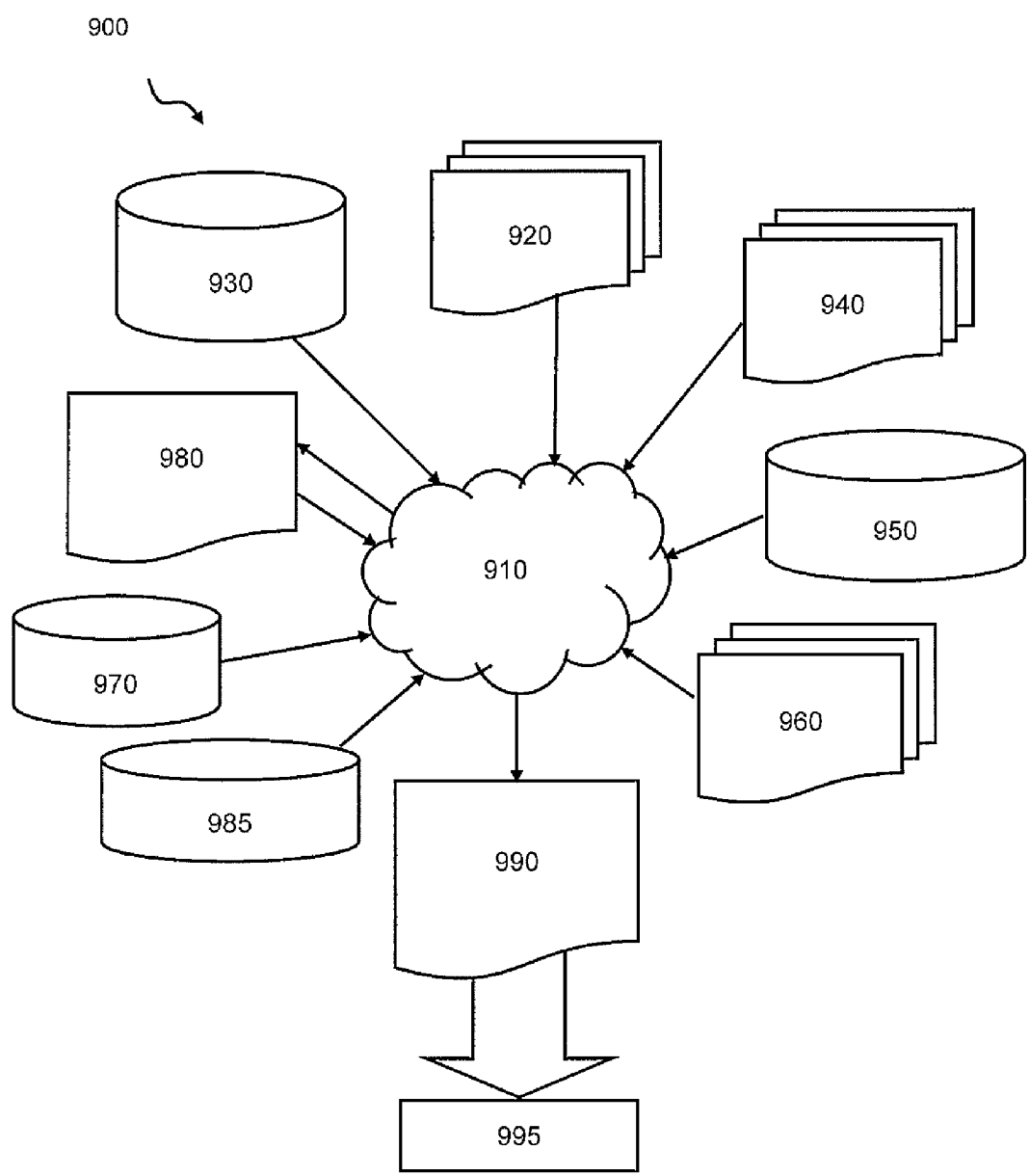
FIG. 4 is a flow diagram of a design process used in semiconductor design, manufacture, and/or test.

FIG. 4 shows a block diagram of an exemplary design flow 900 used for example, in semiconductor design, manufactur-

```
If Valid(Last) = 0                          ; If last processing step did not complete
successfully
    THEN                                    ;   THEN
        Last <= NOT Last                    ;       Back up to previous checkpoint
        DECREASE threshold                  ;       and decrease processing time (power even
getting shorter) Threshold is the duration
        IF Valid(Last) = 0                  ;       IF previous checkpoint also invalid
            THEN *SYSTEM RESET*             ;           THEN we've lost state and must reset system
        END IF
    ELSE                                    ;   ELSE (last processing step completed)
        INCREASE threshold                  ;       Increase processing time threshold
END IF
RESTORE Context(Last)                       ; Restore context from last successful checkpoint
Last<=NOT Last                              ; Flip pointer to next checkpoint storage
Count <= 0                                  ; Initialize processing timer
WHILE Count < Threshold ; Do
    PROCESS DATA                            ; Processing
    INCREMENT COUNT                         ;   increment count
END WHILE                                   ;   until threshold exceeded
SAVE CONTEXT(Last)                          ; checkpoint progress in memory pointed to by last
SAVE Valid(Last)                            ; Validate last checkpoint
Do Forever                                  ; While power exists Do:
    Last<=NOT Last                          ;       Pingpong context memory
    Valid(Last)<='0'                        ;       Clear context valid flag
    INCREASE Threshold                      ;       Increase save threshold count
    WHILE Count < Threshold                 ;           Do Count to Threshold
        PROCESS DATA                        ; Do the data
        INCREMENT COUNT                     ;           Increment save counter
    END WHILE                               ;
    SAVE CONTEXT(Last)                      ;       Save context checkpoint
    Valid(Last)<='1'                        ;       Set context checkpoint valid flag
END DO
```

More specifically, at step 300, the last valid context is restored at start up. At step 305, the system will backup to the previous checkpoint (e.g., "PING"). At step 310, the counter is assigned to "0", e.g., initialized for the next power cycle. At step 315, the data is processed during the power cycle. At step 320, the counter is incremented during the power cycle. At step 325, a determination is made as to whether the count is greater than the threshold. If the count is less than the threshold, processing continues at step 325; however, if the counter is greater than the threshold, the last context is saved at step 330.

ing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIG. 1 in the form of schematics or HDL, a hardware-description language (e.g., Verilog, VHDL, C, etc.).

Design structure 920 may be contained on one or more machine readable medium. For example, design structure 920 may be a text file or a graphical representation of an embodiment of the invention as shown in, for example, FIG. 1. Design process 910 preferably synthesizes (or translates) an embodiment of the invention as shown in, for example, FIG. 1 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, for example, FIG. 1, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, for example, FIG. 1. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A circuit for saving and restoring state in an intermittent power environment comprising:
    a threshold register having a counter configured to increment or decrement at every power cycle in order to set a threshold value of the threshold register; and
    a non-volatile storage, wherein the threshold value of the threshold register is compared with a count register to determine when to save the state into non-volatile storage.

2. The circuit of claim 1, wherein the non-volatile storage is a ping/pong non-volatile storage.

3. The circuit of claim 1, further comprising last and valid flags.

4. The circuit of claim 3, wherein the last and valid flags are configured to be utilized to determine a valid save state in the non-volatile storage.

5. The circuit of claim 3, wherein the last and valid flags are configured to flag a location in the non-volatile storage of a last valid saved state.

6. The circuit of claim 1, further comprising a determination component configured to determine when a value of the threshold has been equaled or exceeded.

7. The circuit of claim 6, wherein the determination component determines when a count of a power up cycle is equal to or has exceeded the threshold.

8. The circuit of claim 6, wherein the determination component is utilized to determine when to save context.

9. The circuit of claim 1, wherein the threshold register, based on the increment and decrement of the counter at every power cycle, learns a time duration of a power pulse in a low or no power environment, and set a saving checkpoint.

10. The circuit of claim 1, wherein:
    the circuit is configured to learn a time duration of a power pulse in a low or no power environment, and set a saving checkpoint; and
    the circuit uses a success/failure of the saving checkpoint to determine whether more processing or less processing can be done during an available power window before the state is saved in the non-volatile memory.

11. A method for predicting and/or estimating a power cycle duration in order to save a state in non-volatile memory, comprising:
    setting a threshold value based on incrementing or decrementing a counter at every power;
    determining that the threshold value has been equaled or exceeded; and
    saving the state in the non-volatile memory at a first checkpoint based on the threshold value being equaled or exceeded.

12. The method of claim 11, wherein the setting includes incrementing a counter until there is a power loss.

13. The method of claim 11, wherein the setting includes decrementing a counter when the state is saved in a previous checkpoint with relation to the first checkpoint.

14. The method of claim 11, wherein the setting includes adjusting a checkpoint based on a current power cycle.

15. The method of claim 11, further comprising providing an indicator of a last and valid saved state.

16. The method of claim 15, further comprising uploading the state from the non-volatile memory in a subsequent power up cycle.

17. The method of claim 11, further comprising setting a flag that states that a failure has occurred recently, where recently is defined as a time period measured by current time and, after the current time has moved beyond a set time period the flag is reset.

18. A design structure embodied in a machine readable medium for designing, manufacturing, or testing an integrated circuit, the design structure comprising:
    a threshold register having a counter configured to increment or decrement during a power cycle in order to adjust the threshold register, wherein the threshold register is configured to learn a time duration of a power pulse in a low or no power environment, and set a saving checkpoint, based on the increment or decrement,
    a count register, and a non-volatile storage for storing a state when a value of the count register equals or exceeds a value of the threshold register.

19. The design structure of claim 18, wherein the design structure comprises a netlist.

20. The design structure of claim 18, wherein the design structure resides on storage medium as a data format used for the exchange of layout data of integrated circuits.

* * * * *